United States Patent
Ebisawa et al.

(10) Patent No.: US 6,539,529 B2
(45) Date of Patent: Mar. 25, 2003

(54) METHOD AND APPARATUS FOR DESIGNING INTEGRATED CIRCUITS AND STORAGE MEDIUM FOR STORING THE METHOD

(75) Inventors: Motoji Ebisawa, Kanagawa (JP); Arata Yamamoto, Kanagawa (JP); Ryouhei Inoue, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/983,584

(22) Filed: Oct. 25, 2001

(65) Prior Publication Data

US 2002/0068989 A1 Jun. 6, 2002

(30) Foreign Application Priority Data

Oct. 26, 2000 (JP) ......................................... 2000-327802

(51) Int. Cl.[7] .............................................. G06F 17/50
(52) U.S. Cl. .............................................. 716/10; 716/8
(58) Field of Search ........................................ 716/1–14

(56) References Cited

U.S. PATENT DOCUMENTS 5,838,581 A * 11/1998 Kuroda ........................... 716/8
5,999,715 A * 12/1999 Sato ................................ 716/5
6,009,248 A * 12/1999 Sato et al. ...................... 716/2
6,145,116 A * 11/2000 Tawada ........................... 716/6
6,198,978 B1 * 3/2001 Takahashi ..................... 700/97

* cited by examiner

Primary Examiner—Vuthe Siek
Assistant Examiner—Sun James Lin
(74) Attorney, Agent, or Firm—Rader, Fishman & Grauer PLLC; Ronald P. Kananen, Esq.

(57) ABSTRACT

Disclosed are a method and an apparatus for designing an integrated circuit, as well as a storage medium for storing the method, whereby repeaters are laid out automatically without overlapping with existing circuit blocks. A set of layout data is input to let the repeaters fully occupy provisionally regions that are free of circuit blocks and ready to accommodate the repeaters. Another set of layout data is generated based on the input layout data to calculate locations in which to insert the repeaters within wiring patterns that fail to meet wiring delay requirements. From among the provisionally laid-out repeaters, those that are closest to the calculated positions are selected. Data about connections of the selected repeaters are added to a net list to update the latter. Data about the layout of the unselected repeaters are removed from the layout data in effect after the provisional layout. The updated net list and the layout data with the unselected repeater layout data removed therefrom are used as a basis for generating wiring patterns of the integrated circuit in question.

21 Claims, 5 Drawing Sheets

METHOD AND APPARATUS FOR DESIGNING INTEGRATED CIRCUITS AND STORAGE MEDIUM FOR STORING THE METHOD

BACKGROUND OF THE INVENTION

The present invention relates to a method and an apparatus for designing integrated circuits, as well as to a storage medium for storing the method. More particularly, the invention relates to a computer-assisted method for designing semiconductor integrated circuits, an apparatus for implementing the method, and a storage medium for storing the method.

Ever-higher operating speeds required of semiconductor integrated circuits have made it increasingly necessary for circuit designs to take into account signal transmission delays (wiring delays) attributable to the parasitic capacities and resistance of wiring. Larger circuit scales and layered layout techniques adopted for circuit fabrication have prolonged wiring patterns, giving rise to a growing number of cases where wiring delays pose a problem in circuit design. Furthermore, processes aimed at fabricating finer circuit structures than ever have tended to increase parasitic capacities between adjacent wires, bringing about crosstalk as another problem in circuit design.

Conventionally, these problems have been bypassed by inserting so-called repeaters in wiring patterns that fail to meet predetermined wiring delay requirements. The repeater is a buffer, such as an inverter or a non-inverter. Inserting repeaters into a wiring pattern reduces the parasitic capacities of the wiring that are driven by a signal output unit of the circuit, whereby signal transmission delays are diminished. Wiring delays are known to increase generally in proportion to the wiring length squared. It follows that a repeater illustratively positioned to bisect a wire at its midpoint cuts the wiring length in half and, thereby, halves the wiring delay provided the delay of the repeater itself is ignored In a conventional semiconductor integrated circuit design, wiring delays of various wiring patterns are calculated on the basis of known delay-related parameters such as lengths, parasitic capacities and resistances of wiring after the cells and layered blocks constituting the circuit have been laid out. For wiring patterns that fail to meet predetermined wiring delay requirements, parameters regarding locations in which to insert repeaters, including their spacing and their numbers, are automatically calculated. The repeaters are then laid out in the calculated locations.

According to the conventional method above, the automatically calculated locations in which to insert certain repeaters can overlap with cells, layered blocks or other repeaters in the circuit. In many cases, such overlaps prevent the repeaters from being laid out as calculated automatically. Circuit designers are then forced manually to designate in advance desired locations for repeater insertion or to relocate repeaters that overlap with other circuits after automatic layout. Such post-layout chores associated with repeater insertion have tended to prolong the design stage for semiconductor integrated circuits.

The present invention has been made in view of the above circumstances and provides a method and an apparatus for designing semiconductor circuits and a storage medium for storing the method, whereby repeaters are automatically laid out to let wiring patterns meet all wiring delay requirements, so that the repeaters will not overlap with existing circuits, such as cells, layered blocks, and other repeaters.

SUMMARY OF THE INVENTION

In carrying out the invention and according to one aspect thereof, there is provided an integrated circuit designing method including the steps of: firstly, inputting layout data for designating a layout of circuit blocks and wiring patterns constituting an integrated circuit on a substrate, the input layout data serving as a basis for generating layout data such as to let delay adjusting circuits fully occupy, on the substrate, regions which are free of the circuit blocks and ready to accommodate the delay adjusting circuits for adjusting wiring delays between the circuit blocks; secondly, designating locations in which to insert the delay adjusting circuits inside wiring patterns which, among the patterns designated by the input layout data, fail to meet predetermined wiring delay requirements, the locations being designated so that the wiring patterns will meet the delay requirements in conjunction with the inserted delay adjusting circuits; thirdly, selecting from among the delay adjusting circuits designated by the layout data generated in the first step, the delay adjusting circuits that are closest to the locations designated in the second step; fourthly, supplementing data about the connections of the circuit blocks in the input layout data with data about the connections of the delay adjusting circuits selected in the third step; fifthly, removing from the layout data generated in the first step the data about a circuit layout not included in the connection data supplemented in the fourth step; and, sixthly, generating wiring patterns of the integrated circuit based on the connection data supplemented in the fourth step and on the layout data from which the data were removed in the fifth step.

In the first step of the inventive integrated circuit designing method, layout data may be input which designate a layout of circuit blocks and wiring patterns constituting an integrated circuit on a substrate. The input layout data may be used as a basis for generating layout data such as to let delay adjusting circuits fully occupy, on the substrate, regions which are free of the circuit blocks and ready to accommodate the delay adjusting circuits for adjusting wiring delays between the circuit blocks.

In the second step, locations may be designated in which to insert the delay adjusting circuits inside wiring patterns which, among the patterns designated by the input layout data, may fail to meet predetermined wiring delay requirements. These locations may be designated so that the wiring patterns will meet the delay requirements in conjunction with the inserted delay adjusting circuits.

In the third step, the delay adjusting circuits that are closest to the locations designated in the second step may be selected from among the delay adjusting circuits designated by the layout data generated in the first step.

In the fourth step, data about the connections of the circuit blocks in the input layout data may be supplemented with data about the connections of the delay adjusting circuits selected in the third step.

In the fifth step, the data about a circuit layout not included in the connection data supplemented in the fourth step may be removed from the layout data generated in the first step.

In the sixth step, wiring patterns of the integrated circuit may be generated based on the connection data supplemented in the fourth step and on the layout data from which the data were removed in the fifth step.

According to another aspect of the invention, there is provided an integrated circuit designing apparatus including: a layout element for inputting layout data for designating a layout of circuit blocks and wiring patterns constituting an integrated circuit on a substrate, the input layout data serving as a basis for generating layout data such as to let delay adjusting circuits fully occupy, on the substrate, regions which are free of the circuit blocks and ready to accommodate the delay adjusting circuits for adjusting wiring delays between the circuit blocks; an insertion location designating element for designating locations in which to insert the delay adjusting circuits inside wiring patterns which, among the patterns designated by the input layout data, fail to meet predetermined wiring delay requirements, the locations being designated so that the wiring patterns will meet the delay requirements in conjunction with the inserted delay adjusting circuits; a selecting element for selecting, from among the delay adjusting circuits designated by the layout data generated by the layout element, the delay adjusting circuits that are closest to the locations designated by the insertion location designating element; a connection data updating element for supplementing data about connections of the circuit blocks in the input layout data with data about connections of the delay adjusting circuits selected by the selecting element; a layout data updating element for removing from the layout data generated by the layout element the data about a circuit layout not included in the connection data supplemented by the connection data updating element; and a wiring pattern generating element for generating wiring patterns of the integrated circuit based on the connection data supplemented by the connection data updating element and on the layout data from which the data were removed by the layout data updating element.

In the inventive integrated circuit designing apparatus, the layout element may input layout data for designating a layout of circuit blocks and wiring patterns constituting an integrated circuit on a substrate. The input layout data may be used as a basis for generating layout data such as to let delay adjusting circuits fully occupy, on the substrate, regions which are free of the circuit blocks and ready to accommodate the delay adjusting circuits for adjusting wiring delays between the circuit blocks.

The insertion location designating element may designate locations in which to insert the delay adjusting circuits inside wiring patterns which, among the patterns designated by the input layout data, may fail to meet predetermined wiring delay requirements. The locations may be designated so that the wiring patterns will meet the delay requirements in conjunction with the inserted delay adjusting circuits.

The selecting element may select, from among the delay adjusting circuits designated by the layout data generated by the layout element, the delay adjusting circuits that are closest to the locations designated by the insertion location designating element.

The connection data updating element may supplement data about the connections of the circuit blocks in the input layout data with data about the connections of the delay adjusting circuits selected by the selecting element.

The layout data updating element may remove from the layout data generated by the layout element the data about a circuit layout not included in the connection data supplemented by the connection data updating element.

The wiring pattern generating element may generate wiring patterns of the integrated circuit based on the connection data supplemented by the connection data updating element and on the layout data from which the data were removed by the layout data updating element.

According to a further aspect of the invention, there is provided a storage medium which stores a program in a manner readable by a computer, the program including the steps of: firstly, inputting layout data for designating a layout of circuit blocks and wiring patterns constituting an integrated circuit on a substrate, the input layout data serving as a basis for generating layout data such as to let delay adjusting circuits fully occupy, on the substrate, regions which are free of the circuit blocks and ready to accommodate the delay adjusting circuits for adjusting wiring delays between the circuit blocks; secondly designating locations in which to insert the delay adjusting circuits inside wiring patterns which, among the patterns designated by the input layout data, fail to meet predetermined wiring delay requirements, the locations being designated so that the wiring patterns will meet the delay requirements in conjunction with the inserted delay adjusting circuits; thirdly selecting, from among the delay adjusting circuits designated by the layout data generated in the first step, the delay adjusting circuits that are closest to the locations designated in the second step; fourthly supplementing data about connections of the circuit blocks in the input layout data with data about connections of the delay adjusting circuits selected in the third step; fifthly removing from the layout data generated in the first step the data about a circuit layout not included in the connection data supplemented in the fourth step; and sixthly, generating wiring patterns of the integrated circuit based on the connection data supplemented in the fourth step and on the layout data from which the data were removed in the fifth step.

Other objects, features and advantages of the invention will become more apparent upon a reading of the following description and appended drawings.

DESCRIPTION OF THE PREFERRED EMBODIMENTS

Figure 1:
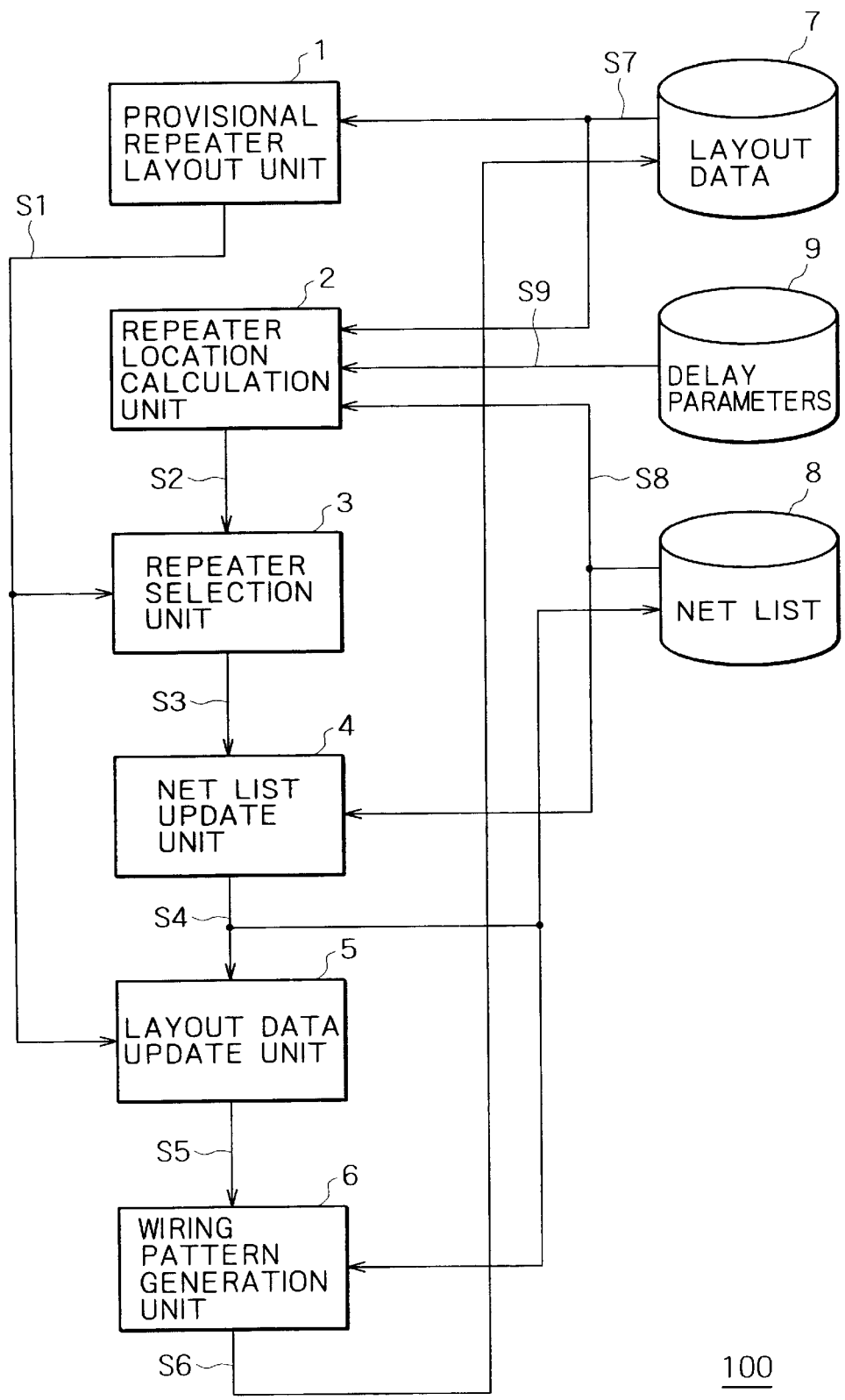
FIG. 1 is a block diagram of a semiconductor integrated circuit designing apparatus embodying the invention.

FIG. 1 is a block diagram of a semiconductor integrated circuit designing apparatus 100 embodying the invention. The apparatus 100 comprises a provisional repeater layout unit 1, a repeater location calculation unit 2, a repeater selection unit 3, a net list update unit 4, a layout data update unit 5, a wiring pattern generation unit 6, a layout data storage unit 8, and a delay parameter storage unit 9.

The provisional repeater layout unit 1 illustratively serves as layout means of this invention, the repeater location calculation unit 2 illustratively serves as insertion location designating means; the repeater selection unit 3 illustratively serves as selecting means; the net list update unit 4 illustratively serves as connection data updating means, the layout data update unit 5 illustratively serves as layout data updating means, and the wiring pattern generation unit 6 illustratively serves as wiring pattern generating means.

Each of the components making up the semiconductor integrated circuit designing apparatus 100 shown in FIG. 1 is described below.

The provisional repeater layout unit 1 inputs layout data S7 from the layout data storage unit 7 and, accordingly causes repeaters to be laid out provisionally in unoccupied regions designated by the input layout data. The layout data S7 are data about the layout of circuit blocks, such as cells and layered blocks, and their wiring patterns constituting a semiconductor integrated circuit. What is input from the layout data storage unit 7 is a set of layout data in effect after most aspects of a circuit layout design have been complete. Based on the input layout data S7, the provisional repeater layout unit 1 generates layout data S1 such as to let the repeaters fully occupy the regions which are free of any circuit blocks and ready to accommodate the repeaters. In other words, the layout data S1 allocate in advance the repeaters to the regions where repeaters may eventually be located selectively in subsequent steps.

The repeater location calculation unit 2 inputs the layout data S7 from the layout data storage unit 7, a net list S8 from the net list storage unit 8, and delay parameters S9 from the delay parameter storage unit 9. Based on these input data, the repeater location calculation unit 2 calculates locations in which to insert repeaters.

The net list constitutes data about the connections of the circuit blocks making up the semiconductor integrated circuit. The delay parameters are parameters associated with wiring delay calculations, such as parasitic capacities and resistances of wiring, as well as input capacities and output impedances of cells, layered blocks and repeaters.

The net list S8 corresponds to the layout data S7 that are entered into the provisional repeater layout unit 1 and into the repeater location calculation unit 2.

The repeater location calculation unit 2 calculates the wiring delay of each of the wiring patterns based on the input layout data S7, net list S8 and delay parameters S9, thereby checking for any wiring pattern that fails to meet predetermined wiring delay requirements. If any wiring pattern not meeting the delay requirements is detected, the repeater location calculation unit 2 calculates locations in which to insert repeaters to make the wiring pattern in question comply with the requirements and outputs the calculated locations as repeater insertion location information S2 to the repeater selection unit 3.

If wiring patterns have, for example, a constant resistance each, then the wiring delay of each pattern is determined by two factors, i.e., by a capacity component made up of the parasitic capacity of the pattern in question and the input capacity of any repeater that may be used, and by age the length of the wiring pattern in question. In other words, if the capacity component is obtained, then the wiring length necessary for the pattern to meet the relevant delay requirements is automatically determined. When the delay parameters S9 are used as a basis for acquiring a capacity component constituted by the parasitic capacity of the wiring and by the input capacity of any repeaters in use, the length of the wiring pattern is determined accordingly and the locations in which to insert repeaters inside the wiring pattern of interest are defined likewise.

The repeater selection unit 3 inputs the layout data S1 generated by the provisional repeater layout unit 1 and the repeater insertion location information S2 calculated by the repeater location calculation unit 2. From among the repeaters provisionally laid out as per the layout data S1, the repeater selection unit 3 selects the repeaters that are closest to the locations designated by the repeater insertion location information S2. Illustratively, the repeaters whose centers of gravity on a plane are closest to the locations designated by the repeater insertion location information S2 are selected from among the repeaters provisionally laid out. Information S3 about the selected repeaters is output to the net list update unit 4.

The net list update unit 4 inputs the information S3 about the repeaters selected by the repeater selection unit 3 and the net list S8 held in the net list storage unit 8 and supplements the input net list S8 with data about connections of the repeaters selected by the repeater selection unit 3. The net list S8 retrieved from the net list storage unit 8 corresponds to the layout data S7 that are entered into the provisional repeater layout unit 1 and the repeater location calculation unit 2.

The data-supplemented net list S4 is output both to the net list storage unit 8 and the layout data update unit 5. The old net list stored in the net list storage unit 8 is replaced by the net list S4.

The layout data update unit 5 inputs both the net list S4 supplemented with data by the net list update unit 4 and the layout data S1 generated by the provisional repeater layout unit 1 and updates the input layout data S1 in accordance with the net list S4. Of the repeaters laid out provisionally by the provisional repeater layout unit 1, the unselected repeaters, i.e., those except for the repeaters selected by the repeater selection unit 3, are not included in the net list S4 and, thus, their connections are unpredictable. For that reason, data about the layout of these excess repeaters are removed from the layout data S1. The layout data S5 given after the selective data removal are output to the wiring pattern generation unit 6.

The wiring pattern generation unit 6 inputs both the net list S4 supplemented with data by the net list update unit 4 and the layout data S5 from which data were removed selectively by the layout data update unit 5. Based on these input data, the wiring pattern generation unit 6 generates wiring patterns automatically. The wiring patterns in the input layout data S5 are then replaced by the generated wiring patterns constituting modified layout data S6. The modified layout data S6 are output to the layout data storage unit 7. The layout data S6 replace the old layout data in the layout data storage unit 7.

The layout data storage unit 7 retains layout data about the layout of circuit blocks, such as cells, layered blocks and repeaters, as well as their wiring patterns making up the semiconductor integrated circuit. The layout data storage unit 7 outputs the layout data S7 to the provisional repeater layout unit 1 or to the repeater location calculation unit 2 in response to their output request. The stored layout data are updated by use of the layout data S8 output by the wiring pattern generation unit 6.

The net list storage unit 8 stores the net list, i.e., data about connections of the circuit blocks constituting the semiconductor integrated circuit. The net list storage unit 8 outputs the net list S8 to the repeater location calculation unit 2 or to the net list update unit 4 in response to their output request. The stored net list is updated by use of the net list S4 output by the net list update unit 4.

The delay parameter storage unit 9 stores delay parameters related to wiring delay calculations, i.e., parameters such as parasitic capacities and resistances of wiring, and input capacities and output impedances of cells, layered blocks and repeaters. The delay parameter storage unit 9 outputs the delay parameters S9 to the repeater location calculation unit 2 in response to an output request of the latter.

Figure 2:
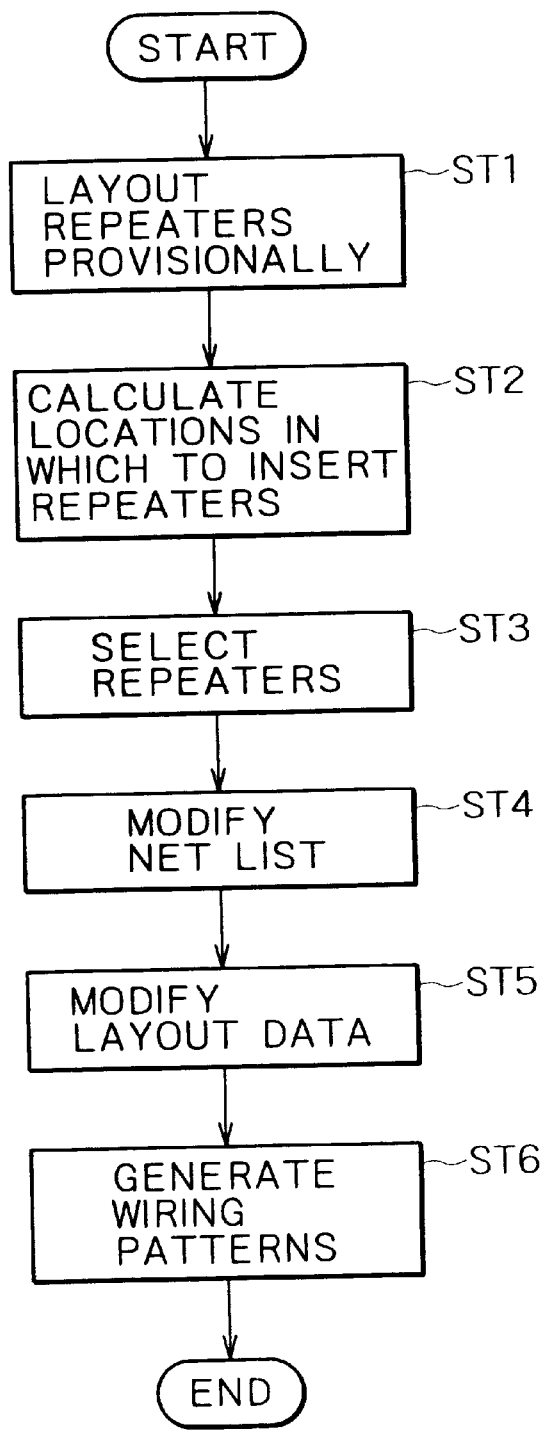
FIG. 2 is a flowchart of the steps in which the designing apparatus of FIG. 1 operates.

How the semiconductor integrated circuit designing apparatus 100 of the above-described constitution operates will now be described with reference to the accompanying drawings. FIG. 2 is a flowchart of steps outlining the workings of the designing apparatus 100.

Step ST1

Step ST1 causes the provisional repeater layout unit 1 to admit the layout data S7 from the layout data storage unit 7. The input layout data S7 are used as a basis for generating layout data S1 such as to let repeaters fully occupy regions which are free of any circuit blocks and which are ready to accommodate the repeaters. In other words, the layout data S1 thus generated allocate in advance repeaters to the regions where some of the repeaters will definitively be located selectively in subsequent steps.

Step ST2

Step ST2 causes the repeater location calculation unit 2 to admit the layout data S7 from the layout data storage unit 7, the net list S8 from the net list storage unit 8, and the delay parameters S9 from the delay parameter storage unit 9. Based on these input data, the repeater location calculation unit 2 calculates wiring delays of the wiring patterns involved, thereby checking for any wiring pattern that fails to meet predetermined wiring delay requirements. If any wiring pattern not meeting the delay requirements is detected, the repeater location calculation unit 2 calculates locations in which to insert repeaters to make the wiring pattern in question comply with the requirements.

Step ST3

Step ST3 causes the repeater selection unit 3 to admit the layout data S1 generated by the provisional repeater layout unit 1 and the repeater insertion location information S2 calculated by the repeater location calculation unit 2. From among the repeaters provisionally laid out as per the layout data S1, the repeater selection unit 3 selects the repeaters that are closest to the locations designated by the repeater insertion location information S2. Illustratively, the repeaters whose centers of gravity on a plane are closest to the locations designated by the repeater insertion location information S2 are selected from among the repeaters provisionally laid out.

Step ST4

Step ST4 causes the net list update unit 4 to admit the information S3 about the repeaters selected by the repeater selection unit 3 and the net list S8 held in the net list storage unit 8 and to supplement the input net list S8 with data about the connections of the repeaters selected by the repeater selection unit 3.

The data-supplemented net list S4 is output to the net list storage unit 8. The old net list stored in the net list storage unit 8 is replaced by the net list S4.

Step ST5

Step ST5 causes the layout data update unit 5 to admit both the net list S4 supplemented with data by the net list update unit 4 and the layout data S1 generated by the provisional repeater layout unit 1 and to update the input layout data S1 in accordance with the net list S4. Of the repeaters laid out provisionally by the provisional repeater layout unit 1, the unselected repeaters, i.e., those except for the repeaters selected by the repeater selection unit 3, are not included in the net list S4 and, thus, their connections are unpredictable. For that reason, data about the layout of these excess repeaters are removed from the layout data S1.

Step ST6

Step ST6 causes the wiring pattern generation unit 6 to admit both the net list S4 supplemented with data by the net list update unit 4 and the layout data S5 from which data were selectively removed by the layout data update unit 5. Based on these input data, the wiring pattern generation unit 6 generates wiring patterns automatically. The wiring patterns in the input layout data S5 are then replaced by the generated wiring patterns constituting modified layout data S6. The modified layout data S6 are output to the layout data storage unit 7. The layout data S6 replace the old layout data in the layout data storage unit 7.

How repeaters are illustratively inserted in a wiring pattern of the semiconductor integrated circuit will now be described in specific terms with reference to the accompanying drawings. FIGS. 3 through 7 are schematic views showing repeaters inserted into a wiring pattern by the semiconductor integrated circuit designing apparatus 100.

Figure 3:
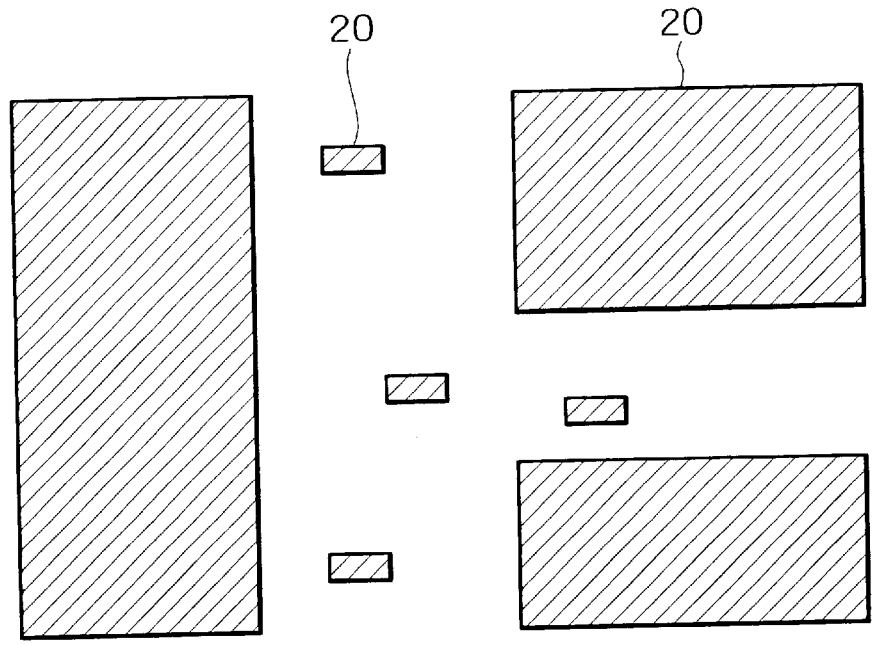
FIG. 3 is a schematic view showing a layout of circuit blocks, such as cells and layered blocks, as designated by layout data.

FIG. 3 depicts a layout of circuit blocks 20, such as cells and layered blocks, as designated by the layout data S7 transferred from the layout data storage unit 7 to the provisional repeater layout unit 1. In FIG. 3, wiring patterns are not shown.

Figure 4:
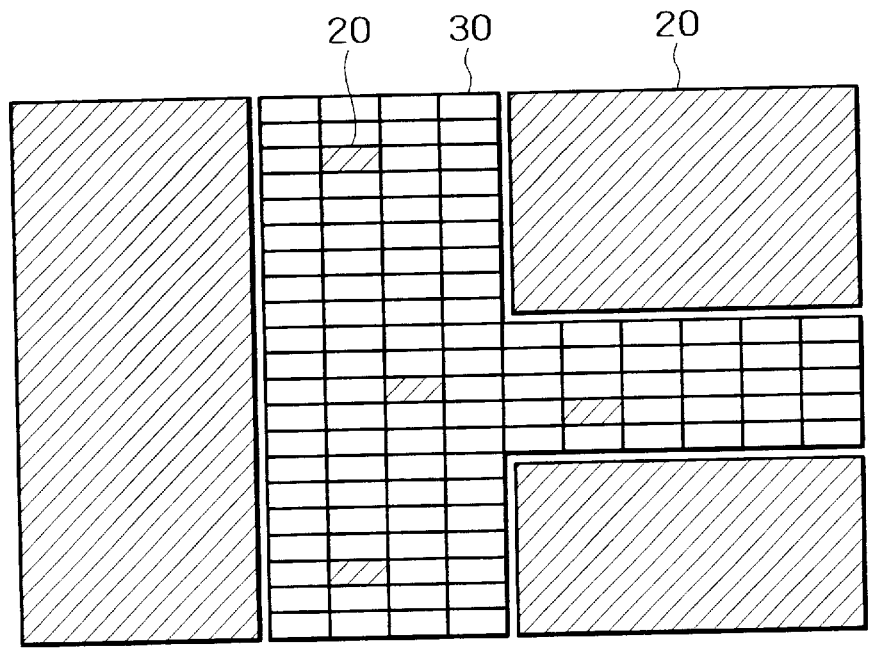
FIG. 4 is a schematic view of repeaters as they are provisionally laid out.

FIG. 4 indicates repeaters 30 as they are provisionally laid out. In FIG. 4, the repeaters 30 are laid out in such a manner as to fully occupy regions which are free of the circuit blocks and which are ready to accommodate the repeaters 30.

Figure 5:
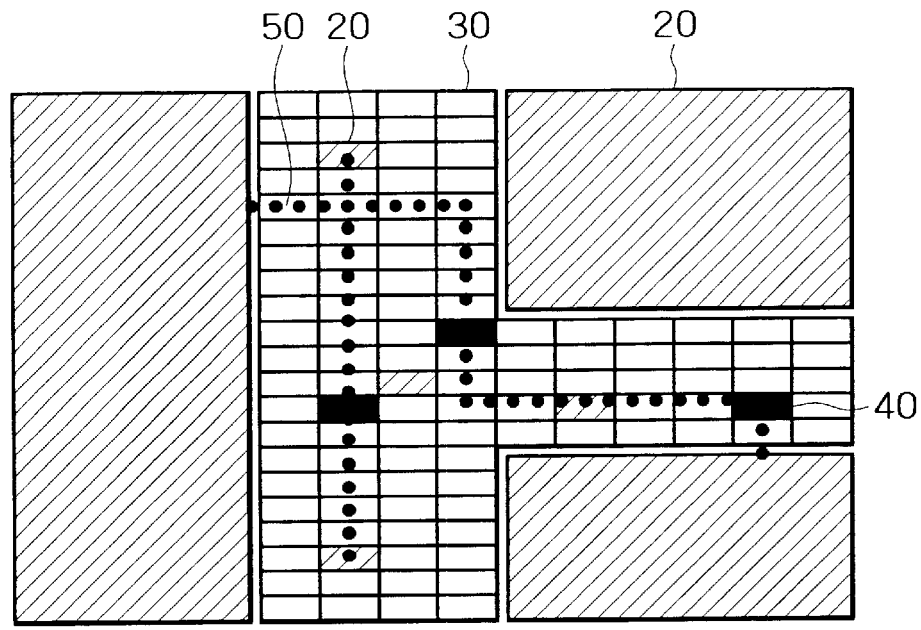
FIG. 5 is a schematic view showing that from among provisionally laid-out repeaters, those closest to the locations calculated by a repeater location calculation unit are selected.

FIG. 5 shows a state in effect when, with step ST2 carried out to calculate locations in which to insert repeaters in a wiring pattern not meeting relevant requirements, step ST3 is executed to select, from among the provisionally laid-out repeaters 30, those repeaters 40 that are closest to the locations calculated in step ST2. Broken lines 50 in FIG. 5 indicate a wiring pattern included in the layout data S7.

Figure 6:
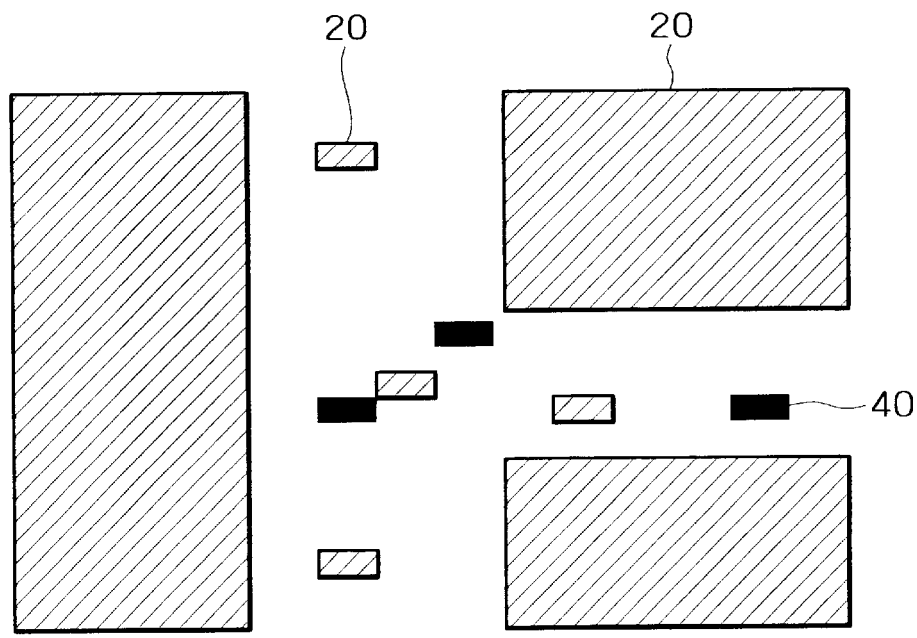
FIG. 6 is a schematic view indicating that all provisionally laid-out repeaters are removed except for those selected.

FIG. 6 illustrates a layout of the circuit blocks 20 and repeaters 40 in effect when, with the net list S8 supplemented by the connection information about the repeaters 40 in step ST4, the layout data S1 are updated in step ST5 in accordance with the net list S8 thus supplemented. As shown in FIG. 6, all repeaters 30 laid out provisionally in step ST1 are removed except for those repeaters 40 selected in step ST3.

Figure 7:
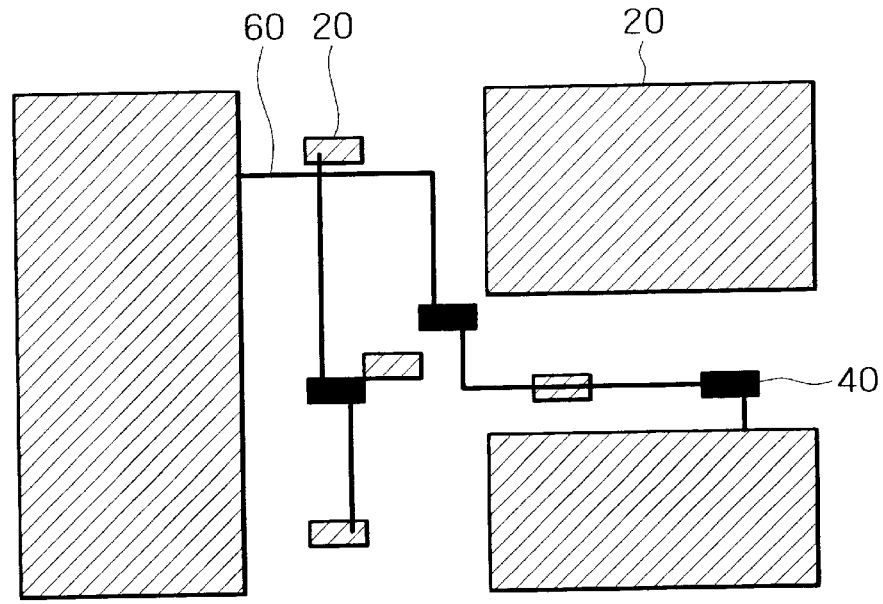
FIG. 7 is a schematic view depicting a wiring pattern that is automatically generated after selective removal of the repeaters.

FIG. 7 depicts a state in effect when the net list S4 supplemented with data in step ST4 and the layout data S5 with data selectively removed therefrom in step ST5 are input to the wiring pattern generation unit 6 so that the unit 6 automatically generates a wiring pattern 60 based on the input data.

In the semiconductor integrated circuit designing apparatus 100 of FIG. 1, as described above, the provisional repeater layout unit 1 admits the layout data S7 designating the layout of circuit blocks, such as cells and layered blocks, and their wiring patterns constituting a semiconductor integrated circuit. Based on the input layout data S7, the provisional repeater layout unit 1 generates the layout data S1 such as to let repeaters fully occupy, on a substrate of the semiconductor integrated circuit, regions which are free of the circuit blocks and ready to accommodate the repeaters. The repeater location calculation unit 2 calculates locations in which to insert repeaters inside wiring patterns which, among the patterns designated by the input layout data S7, fail to meet predetermined wiring delay requirements, the locations being designated so that the wiring patterns will meet the delay requirements in conjunction with the inserted repeaters. The repeater selection unit 3 selects, from among the repeaters designated as per the layout data S1 generated by the provisional repeater layout unit 1, those repeaters that are closest to the locations designated by the repeater location calculation unit 2. The net list update unit 4 supplements the net list S8 corresponding to the layout data S7 with the data about the connections of the repeaters selected by the repeater selection unit 3. The layout data update unit 5 then removes from the layout data S1 generated by the provisional repeater layout unit 1 the data about the circuit layout not included in the net list S4 supplemented with data by the net list update unit 4. Thereafter, the wiring pattern generation unit 6 automatically generates wiring patterns of the semiconductor integrated circuit based on the net list S4 supplemented with data by the net list update unit 4 and the layout data S5 from which data were selectively removed by the layout data update unit 6. In the manner described, after most aspects of the layout design of a semiconductor integrated circuit have been complete, the inventive apparatus determines locations in which to insert repeaters inside wiring patterns that fail to meet predetermined wiring delay requirements. These locations are determined in such a manner that the repeaters therein will not overlap with existing circuit blocks, such as cells and layered blocks. Wiring patterns with the repeaters optimally inserted therein are thus generated automatically. The inventive features free circuit designers from the chores of manually modifying the locations of repeaters overlapping with existing circuit blocks after these repeaters were laid out manually or automatically in an earlier design stage. This improves circuit design efficiency and shortens the period of product development.

The semiconductor integrated circuit designing apparatus 100 according to the invention may be implemented illustratively by a software program running under various operating systems, such as UNIX and Windows. These operating systems and the software program are executed illustratively on the computer system 200 shown in FIG. 8.

Figure 8:
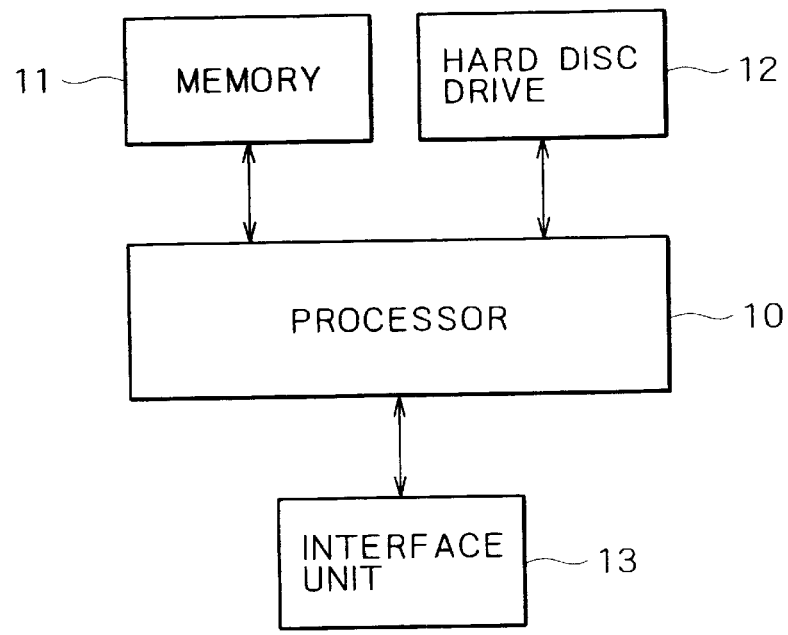
FIG. 8 is a block diagram of a computer system suitable for implementing a software program embodying the invention.

FIG. 8 is a block diagram of a typical computer system on which to run the software program embodying the invention. The computer system 200 in FIG. 8 comprises a processor 10, a memory 11, a hard disc drive 12, and an interface unit 13.

The software program recorded on the hard disc drive 12 is brought into the memory 11 via the processor 10 for temporary storage. The program then is read successively from the memory 11 by the processor 10 for execution. User-issued instructions, such as starting and stopping of processing by the processor 10 and selection of what needs to be processed, are input to the processor 10 via the interface unit 13 equipped illustratively with a keyboard and a mouse. The result of the processing by the processor 10, besides being written to the hard disc drive 12, is presented to the user by the interface unit 13 illustratively using a display device.

Where this invention is to be implemented by means of the software program, the program may be read into the processor not only from the hard disc drive 12 in FIG. 8 but also from diverse kinds of external storage media including a CD-ROM, an MO and a DVD. It also is possible to execute the software program after downloading it from a server device to the user's client terminal device connected to the server over a network.

To sum up, the inventive apparatus is capable of determining locations in which to insert repeaters within wiring patterns that fail to meet predetermined wiring delay requirements, the locations being defined in such a manner that the repeaters therein will not overlap with existing circuit blocks, such as cells and layered blocks. Wiring patterns with the repeaters optimally inserted therein are thus generated automatically. These features free circuit designers from the chore of manually modifying the locations of repeaters overlapping with existing circuit blocks after these repeaters were laid out manually or automatically in an earlier design stage. This improves circuit design efficiency and shortens the period of product development.

As many apparently different embodiments of this invention may be made without departing from the spirit and scope thereof, it is to be understood that the invention is not limited to the specific embodiments thereof.

What is claimed is:

1. An integrated circuit designing method comprising the steps of:

designating where a plurality of circuit blocks are to be placed on a circuit area of a substrate,
input layout data being used to designate said placement of said plurality of circuit blocks,
said circuit area being a portion of said substrate where a circuit is to be placed;

allocating a plurality of delay adjusting circuits to a plurality of regions of said circuit area,
said plurality of regions being all portions of said circuit area that are unoccupied by said plurality of circuit blocks,
said plurality of regions being one of a path region and a non-path region,
said path region being a portion of said circuit area where a wire pattern of a plurality of wiring patterns will be designated for passage, said path region accommodating a first delay adjusting circuit of said plurality of delay adjusting circuits,
said non-path region being another portion of said circuit area where none of said plurality of wiring patterns will be designated for passage, said non-path region accommodating another delay adjusting circuit of said plurality of delay adjusting circuits,
said another delay adjusting circuit being separate and distinct from said first delay adjusting circuit;

designating said wire pattern for passage, said wire pattern connecting one of said plurality of circuit blocks to another of said plurality of circuit blocks;

calculating a performance requirement for said wiring pattern;

designating said first delay adjusting circuit for placement in said path region when said wiring pattern fails to meet said performance requirement;

placing said first delay adjusting circuit in said path region,
said performance requirement being met when said first delay adjusting circuit placed at said path region is connected to said wiring pattern;

modifying an input net list to generate a modified net list,
said input net list defining said wiring pattern,
said wiring pattern providing the connection between one of said plurality of circuit blocks and another of said plurality of circuit blocks,
said modified net list defining the connection between said first delay adjusting circuit and said wiring pattern;

modifying said input layout data to generate modified layout data,
all of said plurality of delay adjusting circuits that are unconnected to any of said plurality of wiring patterns being eliminated from said modified layout data;
generating said plurality of wiring patterns from said modified layout data and from said modified net list.

2. The method of claim 1 wherein, said first delay adjusting circuit designated for said placement in said path region is a delay adjusting circuit of said plurality of delay adjusting circuits that is closest to said path region.

3. The method of claim 1 wherein, said first delay adjusting circuit is a repeater circuit.

4. The method of claim 1 wherein, said plurality of circuit blocks include cells and layered blocks.

5. The method of claim 1 wherein, said performance requirement is a wire delay of said wiring pattern.

6. The method of claim 5 wherein, said step of calculating further comprising:
using input layout data, an input net list and delay parameters to calculate said wiring delay.

7. The method of claim 6 wherein, said delay parameters are associated with wiring delay calculations, said delay parameters include parasitic capacities and resistances of wiring, input capacities and output impedances of said plurality of circuit blocks and said plurality of delay adjusting circuits.

8. A storage medium that stores a program in a manner readable by a computer, said program comprising the steps of:
designating where a plurality of circuit blocks are to be placed on a circuit area of a substrate,
input layout data being used to designate said placement of said plurality of circuit blocks,
said circuit area being a portion of said substrate where a circuit is to be placed;
allocating a plurality of delay adjusting circuits to a plurality of regions of said circuit area,
said plurality of regions being all portions of said circuit area that are unoccupied by said plurality of circuit blocks,
said plurality of regions being one of a path region and a non-path region,
said path region being a portion of said circuit area where a wire pattern of a plurality of wiring patterns will be designated for passage, said path region accommodating a first delay adjusting circuit of said plurality of delay adjusting circuits,
said non-path region being another portion of said circuit area where none of said plurality of wiring patterns will be designated for passage, said non-path region accommodating another delay adjusting circuit of said plurality of delay adjusting circuits,
said another delay adjusting circuit being separate and distinct from said first delay adjusting circuit;
designating said wire pattern for passage, said wire pattern connecting one of said plurality of circuit blocks to another of said plurality of circuit blocks;
calculating a performance requirement for said wiring pattern;
designating said first delay adjusting circuit for placement in said path region when said wiring pattern fails to meet said performance requirement;
placing said first delay adjusting circuit in said path region,
said performance requirement being met when said first delay adjusting circuit placed at said path region is connected to said wiring pattern;
modifying an input net list to generate a modified net list, said input net list defining said wiring pattern,
said wiring pattern providing the connection between one of said plurality of circuit blocks and another of said plurality of circuit blocks,
said modified net list defining the connection between said first delay adjusting circuit and said wiring pattern;
modifying said input layout data to generate modified layout data,
all of said plurality of delay adjusting circuits that are unconnected to any of said plurality of wiring patterns being eliminated from said modified layout data;
generating said plurality of wiring patterns from said modified layout data and from said modified net list.

9. The storage medium of claim 8 wherein, said first delay adjusting circuit designated for said placement in said path region is a delay adjusting circuit of said plurality of delay adjusting circuits that is closest to said path region.

10. The storage medium of claim 8 wherein, said first delay adjusting circuit is a repeater circuit.

11. The storage medium of claim 8 wherein, said plurality of circuit blocks include cells and layered blocks.

12. The storage medium of claim 8 wherein, said performance requirement is a wire delay of said wiring pattern.

13. The storage medium of claim 12 wherein, said step of calculating further comprising:
using input layout data, an input net list and delay parameters to calculate said wiring delay.

14. The storage medium of claim 13 wherein, said delay parameters are associated with wiring delay calculations, said delay parameters include parasitic capacities and resistances of wiring, input capacities and output impedances of said plurality of circuit blocks and said plurality of delay adjusting circuits.

15. An integrated circuit designing apparatus comprising:
a provisional repeater layout unit, said provisional repeater layout unit receiving input layout data from a layout data storage medium,
said provisional repeater layout unit using said input layout data to designate where a plurality of circuit blocks are to be placed on a circuit area of a substrate, said circuit area being a portion of said substrate where a circuit is to be placed,
said provisional repeater layout unit allocating a plurality of delay adjusting circuits to a plurality of regions of said circuit area,
said plurality of regions being all portions of said circuit area that are unoccupied by said plurality of circuit blocks,
said plurality of regions being one of a path region and a non-path region,
said path region being a portion of said circuit area where a wire pattern of a plurality of wiring patterns will be designated for passage, said path region accommodating a first delay adjusting circuit of said plurality of delay adjusting circuits,
said non-path region being another portion of said circuit area where none of said plurality of wiring patterns will be designated for passage, said non-path region accommodating another delay adjusting circuit of said plurality of delay adjusting circuits, said another delay adjusting circuit being separate and distinct from said first delay adjusting circuit;

a repeater location calculation unit, said repeater location calculation unit receiving said input layout data and receiving an input net list from a net list data storage medium, said input net list defining said wiring pattern, said wiring pattern providing the connection between one of said plurality of circuit blocks and another of said plurality of circuit blocks, said repeater location calculation unit using said input layout data, said input net list and delay parameters to calculate a performance requirement for said wiring pattern, said wire pattern connecting one of said plurality of circuit blocks to another of said plurality of circuit blocks;

a repeater selection unit, said repeater selection unit designating said first delay adjusting circuit for placement in said path region when said wiring pattern fails to meet said performance requirement, said repeater selection unit placing said first delay adjusting circuit in said path region, said performance requirement being met when said first delay adjusting circuit placed at said path region is connected to said wiring pattern;

a net list update unit, said net list update unit modifying said input net list to generate a modified net list, said modified net list defining the connection between said first delay adjusting circuit and said wiring pattern;

a layout data update unit, said layout data update unit modifying said input layout data to generate modified layout data, all of said plurality of delay adjusting circuits that are unconnected to any of said plurality of wiring patterns being eliminated from said modified layout data;

a wire pattern generation unit, said wire pattern generation unit generating said plurality of wiring patterns from said modified layout data and from said modified net list, said modified layout data being stored within said layout data storage medium.

16. The integrated circuit of claim 15 wherein, said first delay adjusting circuit designated for said placement in said path region is a delay adjusting circuit of said plurality of delay adjusting circuits that is closest to said path region.

17. The integrated circuit of claim 15 wherein, said first delay adjusting circuit is a repeater circuit.

18. The integrated circuit of claim 15 wherein, said plurality of circuit blocks include cells and layered blocks.

19. The integrated circuit of claim 15 wherein, said performance requirement is a wire delay of said wiring pattern.

20. The storage medium of claim 19 wherein, said step of calculating further comprising:

using input layout data, an input net list and delay parameters to calculate said wiring delay.

21. The storage medium of claim 20 wherein, said delay parameters are associated with wiring delay calculations, said delay parameters include parasitic capacities and resistances of wiring, input capacities and output impedances of said plurality of circuit blocks and said plurality of delay adjusting circuits.

* * * * *